US009999947B2

(12) United States Patent
Elliot et al.

(10) Patent No.: US 9,999,947 B2
(45) Date of Patent: Jun. 19, 2018

(54) METHOD FOR REPAIRING HEATERS AND CHUCKS USED IN SEMICONDUCTOR PROCESSING

(71) Applicant: COMPONENT RE-ENGINEERING COMPANY, INC., Santa Clara, CA (US)

(72) Inventors: Brent Elliot, Cupertino, CA (US); Frank Balma, Los Gatos, CA (US); Alexander Veytser, Mountain View, CA (US); Michael Parker, Brentwood, CA (US); Jeff Cunha, San Jose, CA (US)

(73) Assignee: Component Re-Engineering Company, Inc., Santa Clara, CA (US)

( * ) Notice: Subject to any disclaimer, the term of this patent is extended or adjusted under 35 U.S.C. 154(b) by 0 days. days.

(21) Appl. No.: 15/133,934

(22) Filed: Apr. 20, 2016

(65) Prior Publication Data

US 2017/0072516 A1    Mar. 16, 2017

Related U.S. Application Data

(60) Provisional application No. 62/155,598, filed on May 1, 2015, provisional application No. 62/249,559, filed on Nov. 2, 2015.

(51) Int. Cl.
*B23K 31/02* (2006.01)
*B23P 6/00* (2006.01)
(Continued)

(52) U.S. Cl.
CPC .............. *B23P 6/00* (2013.01); *B23K 1/0008* (2013.01); *B23K 1/19* (2013.01); *B23K 35/286* (2013.01);
(Continued)

(58) Field of Classification Search
CPC .. B23P 6/00; H01L 21/6833; H01L 21/67103; H01L 21/68785; B23K 1/0008;
(Continued)

(56) References Cited

U.S. PATENT DOCUMENTS 5,392,981 A   2/1995   Makoweicki et al.
5,451,279 A   9/1995   Kohinata et al.
(Continued)

FOREIGN PATENT DOCUMENTS

EP    1094513 A2 *  4/2001    ......... H01L 21/6833
JP    2002-076214 A   3/2002
(Continued)

OTHER PUBLICATIONS

PCT Intl. Search Report, PCT/US2016/029057 dated Jul. 18, 2016.
(Continued)

*Primary Examiner* — Kiley Stoner
(74) *Attorney, Agent, or Firm* — Michael A. Guth

(57) ABSTRACT

A method for the repair of a heater, or an electrostatic chuck, using a ceramic top layer joined with a hermetically sealed joint. The heater or electrostatic chuck may be machined down to remove a damaged top surface, and to allow for the joining of a new top surface. The new top pieces may be aluminum nitride and the pieces may be brazed with an aluminum alloy under controlled atmosphere. The joint material is adapted to later withstand both the environments within a process chamber during substrate processing, and the oxygenated atmosphere which may be seen within the shaft of a heater or electrostatic chuck.

22 Claims, 14 Drawing Sheets

(51) Int. Cl.

| | | |
|---|---|---|
| *C04B 37/00* | (2006.01) | |
| *B23K 1/00* | (2006.01) | |
| *B23K 1/19* | (2006.01) | |
| *B23K 35/28* | (2006.01) | |
| *H01L 21/67* | (2006.01) | |
| *H01L 21/687* | (2006.01) | |
| *H01L 21/683* | (2006.01) | |
| *B23K 103/00* | (2006.01) | |
| *B23K 101/20* | (2006.01) | |

(52) U.S. Cl.
CPC ........ *C04B 37/00* (2013.01); *H01L 21/67103* (2013.01); *H01L 21/6833* (2013.01); *H01L 21/68785* (2013.01); *B23K 2201/20* (2013.01); *B23K 2203/52* (2015.10)

(58) Field of Classification Search
CPC .... B23K 35/286; B23K 1/19; B23K 2201/20; B23K 2203/52; B23K 1/00; B23K 37/04–37/0461; B23K 2203/10; C04B 37/00
USPC ........................ 228/119, 121–124.7, 245–262
See application file for complete search history.

(56) References Cited

U.S. PATENT DOCUMENTS

| | | | | |
|---|---|---|---|---|
| 5,463,526 A * | 10/1995 | Mundt | ................... | C23C 28/00 361/230 |
| 5,794,838 A | 8/1998 | Ushikoshi et al. | | |
| 5,815,366 A * | 9/1998 | Morita | ................ | H01L 21/6833 279/128 |
| 6,069,785 A * | 5/2000 | Ha | ..................... | H01L 21/6833 279/128 |
| 6,117,349 A * | 9/2000 | Huang | ............... | H01J 37/32431 156/345.3 |
| 6,261,703 B1 | 7/2001 | Sasaki et al. | | |
| 6,328,198 B1 | 12/2001 | Ohashi et al. | | |
| 6,364,957 B1 * | 4/2002 | Schneider | ........... | C23C 16/4585 118/500 |
| 6,447,626 B1 | 9/2002 | Ohashi | | |
| 6,483,690 B1 * | 11/2002 | Nakajima | .......... | H01L 21/6833 361/234 |
| 6,756,132 B2 | 6/2004 | Fujii et al. | | |
| 6,921,881 B2 | 6/2005 | Ito et al. | | |
| 7,098,428 B1 | 8/2006 | Elliot et al. | | |
| 9,536,769 B1 * | 1/2017 | Sadjadi | ................ | H01L 21/6833 |
| 9,627,231 B2 * | 4/2017 | Narendrnath | ..... | H01L 21/67005 |
| 9,669,653 B2 * | 6/2017 | Parkhe | .................... | B44C 1/221 |
| 9,673,078 B2 * | 6/2017 | Miyashita | ........... | H01L 21/6833 |
| 2002/0075624 A1 | 6/2002 | Wang et al. | | |
| 2005/0118450 A1 | 6/2005 | Fujii et al. | | |
| 2006/0096946 A1 * | 5/2006 | Schaepkens | ...... | H01L 21/67103 216/13 |
| 2006/0115323 A1 | 6/2006 | Coppeta et al. | | |
| 2006/0158821 A1 * | 7/2006 | Miyashita | ............. | H01L 21/683 361/233 |
| 2006/0175320 A1 * | 8/2006 | Fujii | ................. | H01L 21/67103 219/543 |
| 2007/0103844 A1 * | 5/2007 | Eguchi | ............. | H01L 21/67103 361/234 |
| 2007/0169703 A1 | 7/2007 | Elliot et al. | | |
| 2008/0087710 A1 | 4/2008 | Glaseser | | |
| 2009/0034147 A1 * | 2/2009 | Narendrnath | ....... | H01L 21/6831 361/234 |
| 2009/0034148 A1 * | 2/2009 | Lubomirsky | ....... | H01L 21/6833 361/234 |
| 2009/0034149 A1 * | 2/2009 | Lubomirsky | ....... | H01L 21/6833 361/234 |
| 2010/0025372 A1 * | 2/2010 | Tsujimoto | ......... | H01J 37/32091 216/71 |
| 2010/0027188 A1 * | 2/2010 | Liu | ..................... | H01L 21/6833 361/234 |
| 2010/0045316 A1 * | 2/2010 | Avoyan | ............... | H01L 21/6833 324/762.05 |
| 2010/0088872 A1 * | 4/2010 | Shih | .................... | H01L 21/6833 29/402.01 |
| 2010/0109263 A1 * | 5/2010 | Jun | .................... | H01L 21/67103 279/128 |
| 2010/0242844 A1 | 9/2010 | Kuibira et al. | | |
| 2011/0034032 A1 | 2/2011 | Itoh et al. | | |
| 2011/0288648 A1 | 11/2011 | Joseph et al. | | |
| 2012/0076574 A1 * | 3/2012 | Parkhe | .................. | B23K 1/0008 403/272 |
| 2012/0154974 A1 * | 6/2012 | Bhatnagar | ......... | H01L 21/67017 361/234 |
| 2012/0307412 A1 * | 12/2012 | Boyd, Jr. | ............ | H01L 21/6833 361/234 |
| 2013/0052339 A1 * | 2/2013 | Shih | .................... | H01L 21/6831 427/126.4 |
| 2013/0094820 A1 * | 4/2013 | Takeda | ..................... | B23P 6/00 385/98 |
| 2013/0136878 A1 * | 5/2013 | Elliot | ................... | B23K 1/0016 428/34.6 |
| 2013/0155569 A1 * | 6/2013 | Suuronen | ............... | B23Q 3/152 361/234 |
| 2014/0083461 A1 * | 3/2014 | Shih | .................... | H01L 21/6833 134/19 |
| 2014/0099485 A1 * | 4/2014 | Narendrnath | ..... | H01L 21/67092 428/201 |
| 2014/0118880 A1 * | 5/2014 | He | ...................... | H01L 21/6833 361/236 |
| 2014/0197227 A1 | 7/2014 | Elliot et al. | | |
| 2014/0263176 A1 * | 9/2014 | Parkhe | .................... | B44C 1/221 216/53 |
| 2014/0268478 A1 * | 9/2014 | Raj | ................... | H01L 21/6831 361/234 |
| 2014/0291311 A1 * | 10/2014 | Cho | .................... | H01L 21/6833 219/221 |
| 2015/0036259 A1 * | 2/2015 | Cox | .................... | H01L 21/6833 361/234 |
| 2015/0129165 A1 * | 5/2015 | Parkhe | ................. | H01L 21/6833 165/67 |
| 2015/0228513 A1 * | 8/2015 | Parkhe | .............. | H01L 21/67103 219/444.1 |
| 2015/0235889 A1 * | 8/2015 | Shih | .................... | H01L 21/6833 279/128 |
| 2015/0311105 A1 * | 10/2015 | Sadjadi | .................. | H04N 7/181 438/798 |
| 2015/0357222 A1 * | 12/2015 | Miyashita | ........... | H01L 21/6833 361/234 |
| 2016/0027678 A1 * | 1/2016 | Parkhe | ................. | H01L 21/6833 279/128 |
| 2016/0185672 A1 * | 6/2016 | Elliot | ................... | B23K 1/0016 156/89.27 |
| 2016/0233121 A1 * | 8/2016 | Kim | ....................... | H02N 13/00 |
| 2017/0004988 A1 * | 1/2017 | Sadjadi | ................ | H01L 21/6833 |
| 2017/0110358 A1 * | 4/2017 | Sadjadi | ................ | H01L 21/6833 |
| 2017/0140970 A1 * | 5/2017 | Boyd, Jr. | ................. | C04B 41/00 |
| 2017/0167018 A1 * | 6/2017 | Boyd, Jr. | ............... | C23C 16/4584 |
| 2017/0173934 A1 * | 6/2017 | Narendrnath | ....... | B32B 37/1292 |

FOREIGN PATENT DOCUMENTS

| | | | | |
|---|---|---|---|---|
| JP | 2012060108 A | * | 3/2012 | ......... H01L 21/6833 |
| JP | 2014068011 A | * | 4/2014 | ......... H01L 21/6833 |
| WO | WO 2012020831 A1 | * | 2/2012 | ......... H01L 21/6833 |

OTHER PUBLICATIONS

PCT Written Opinion, PCT/US2016/029057 dated Jul. 18, 2016.
Saiz; Tomsia; Suganuma: Wetting and strength issues at Al/&-alumina interfaces; Journal of European Ceramic Society 23 (2003) 2787-2796.
Nicholas et al., Some observations on the wetting and bonding of nitride ceramics, Journal of Materials Science 25 (1990), Chapman and Hall Ltd.

(56) References Cited

OTHER PUBLICATIONS

Rhee, Wetting of Ceramics by Liquid Aluminum, Fall Meeting of the Ceramic-Metal Systems Division of the American Ceramic Society, Fort Worth, Texas, Sep. 10 1968.

* cited by examiner

METHOD FOR REPAIRING HEATERS AND CHUCKS USED IN SEMICONDUCTOR PROCESSING

CROSS-REFERENCE TO RELATED APPLICATIONS

This application claims priority to U.S. Provisional Patent Application No. 62/155,598 to Elliot et al., filed May 1, 2015, which is hereby incorporated by reference in its entirety. This application claims priority to U.S. Provisional Patent Application No. 62/249,559 to Elliot et al., filed Nov. 2, 2015, which is hereby incorporated by reference in its entirety.

BACKGROUND

Field of the Invention

The present invention relates to methods for repairing semiconductor processing equipment, and more particularly to repairing a substrate support pedestal.

Description of Related Art

The making of ceramics, and the joining of ceramic materials, may involve processes which require very high temperatures and very high contact pressures. For example, liquid phase sintering may be used to join ceramic materials together. The hot pressing/sintering of a large, complex ceramic piece requires a large physical space within a very specialized process oven. Heaters and electrostatic chucks used in semiconductor processing may be made of ceramic, and may be manufactured using a hot pressing process.

The use of ceramics in substrate support pedestals used in semiconductor processing has increased substantially over the last two decades. Substrate support pedestals (commonly called heaters, electrostatic chucks (or e-chucks or ESCs), vacuum chucks, vacuum pedestals, or just pedestals) are often active participants in the processing of semiconductor devices, and can provide numerous functions to assist in producing the desired process results. These functions can include, but are not limited to, heating, cooling, substrate clamping (either electrostatically or with vacuum), providing gases or vacuum to the substrate and its processing environment, and other functions. Ceramics have become the material of choice for many of these substrate support pedestals due to certain properties of ceramic materials, namely good electrical insulation, high operating temperatures, transparency to certain electric fields, excellent corrosion resistance, and good mechanical stability.

One drawback to the use of ceramics is the high cost associated with manufacturing these substrate support pedestals using ceramic materials. Ceramic substrate support pedestals typically cost tens of thousands of dollars each, and in some cases can exceed one hundred thousand dollars. A typical semiconductor manufacturing facility has thousands of substrate support pedestals. Due to the harsh operating environments, ceramic substrate support pedestals have a finite lifetime, typically lasting only 1 to 3 years. A large semiconductor fabrication factory can spend tens of millions of dollars per year on replacement ceramic substrate support pedestals.

One of the more common failings with a chuck or heater is that the top surface may become damaged, which may include pitting on the top surface, or warping. These types of failures may be seen as soon as three months into the life of the heater or chuck. Typical end-of-life for ceramic substrate support pedestals is caused by the top surface of the ceramic being worn, etched, cracked, or otherwise damaged, rendering the ceramic substrate support pedestal ineffective at producing the desired process results.

Presently, a damaged top surface of a substrate support pedestal may be refreshed by machining down to a new, smooth, defect free top surface. This may be done once, sometimes more, on many devices. The ceramic layer above an embedded heater, or above an RF antenna, is not too thick, because if the top layer is too thick then pedestal will not function at a high performance level. Thus, there is not much material available to allow for repeated machining of the top surface. Also, substrate support pedestals may be designed, or tuned, for use with a specific top layer thickness. A repair procedure which could result in a top layer of the same thickness as the original device may be preferred.

What is called for is a repair method which allows for the repair of substrate support pedestals such that the life of these very expensive items can be extended.

SUMMARY OF THE INVENTION

A method for the repair of a heater, or an electrostatic chuck, using a ceramic top layer joined with a hermetically sealed joint. The heater or electrostatic chuck may be machined down to remove a damaged top surface, and to allow for the joining of a new top surface. The new top pieces may be aluminum nitride and the pieces may be brazed with an aluminum alloy under controlled atmosphere. The joint material is adapted to later withstand both the environments within a process chamber during substrate processing, and the oxygenated atmosphere which may be seen within the shaft of a heater or electrostatic chuck.

DETAILED DESCRIPTION

Some prior processes for the joining of ceramic materials required specialized ovens, and compression presses within the ovens, in order to join the materials. For example, with liquid phase sintering, two pieces may be joined together under very high temperatures and contact pressures. The high temperature liquid-phase sintering process may see temperatures in the range of 1700 C and contact pressures in the range of 2500 psi. When a substrate support pedestal is manufactured using such processes, significant amounts of time are needed, specialized ovens, presses, and fixturing, and the overall process is very expensive.

Figure 1:
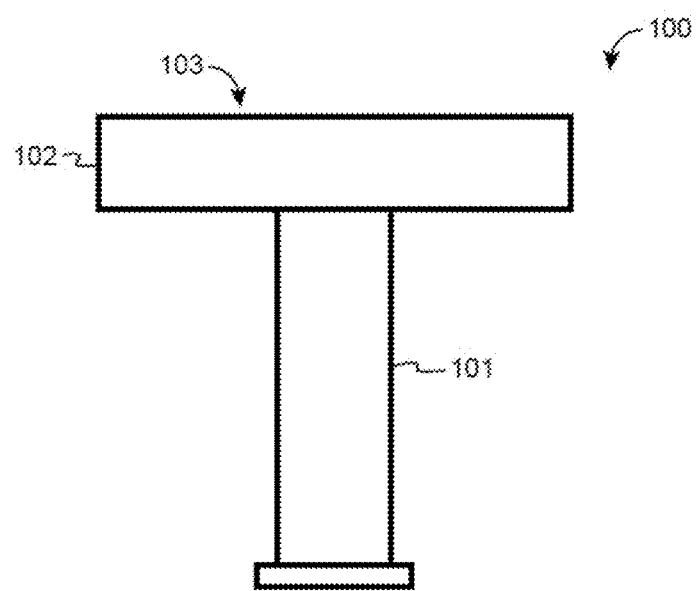
FIG. 1 is a view of a plate and shaft device used in semiconductor processing according to some embodiments of the present invention.

In contrast to the aforementioned high temperature processes, an example of a joined ceramic end product which may be manufactured according to embodiments of the present invention is the repair of a heater assembly, or other type of substrate support pedestal, used in semiconductor processing. FIG. 1 illustrates an exemplary substrate support pedestal 100, such as a heater, used in semiconductor processing. In some aspects, the substrate support pedestal 100 is composed of a ceramic, such as aluminum nitride. The heater has a shaft 101 which in turn supports a plate 102. The plate 102 has a top surface 103. The shaft 101 may be a hollow cylinder. The plate 102 may be a flat disc. Other subcomponents may be present. Although illustrated here with a narrow shaft relative to the plate diameter, the repair processes described herein may be applied to substrate support pedestals which have broad bases as well.

Figure 2:
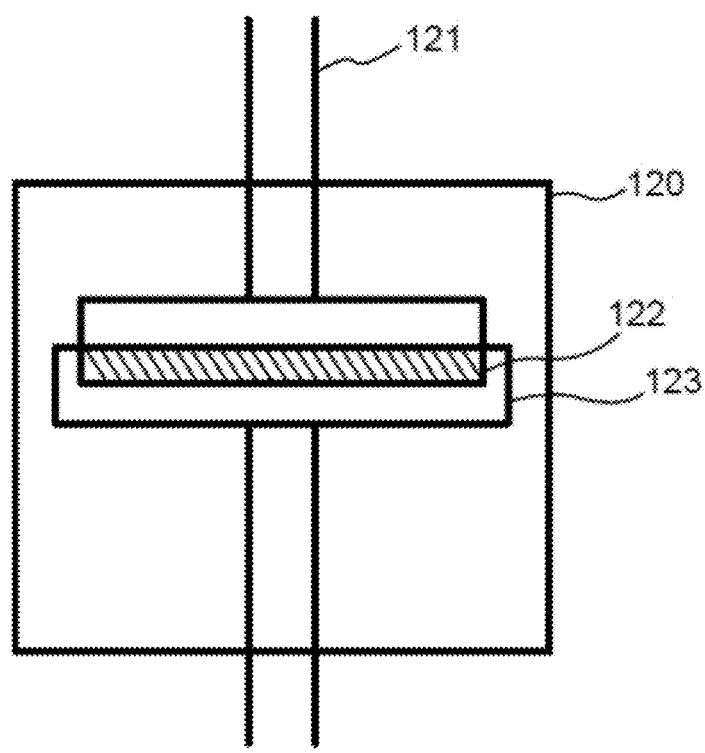
FIG. 2 is a sketch of a high temperature press and oven for a plate according to some embodiments of the present invention.

FIG. 2 conceptually illustrates a process oven 120 with a press 121. The plate 122 may be compressed under temperature in a fixture 123 adapted to be pressed by the press 121. The shaft 101 may also be similarly manufactured in a process step. In a typical process, the plate and shaft are formed by loading of aluminum nitride powder incorporating a sintering aide such as yttria at about 4 weight % into a mold, followed by compaction of the aluminum nitride powder into a "solid" state typically referred to as "green" ceramic, followed by a high-temperature liquid-phase sintering process which densifies the aluminum nitride powder into a solid ceramic body. The high temperature liquid-phase sintering process may see temperatures in the range of 1700 C and contact pressures in the range of 2500 psi. The bodies are then shaped into the required geometry by standard grinding techniques using diamond abrasives.

There are multiple functions of the shaft: one is to provide vacuum-tight electrical communication through the wall of the vacuum chamber in order to apply electrical power to heater elements as well as a variety of other electrode types which may be embedded within the heater plate. Another is to allow temperature monitoring of the heater plate using a monitoring device such as a thermocouple, and allowing that thermocouple to reside outside of the processing chamber in order to avoid interaction such as corrosion between the materials of the thermocouple and the process chemicals, as well as allowing the thermocouple junction to operate in a non-vacuum environment for rapid response. Another function is to provide isolation of the materials used for the previously mentioned electrical communication from the processing environment. Materials used for electrical communication are typically metallic, which could thereby interact with process chemicals used in the processing environment in ways which could be detrimental to the processing results, and detrimental to the lifetime of the metallic materials used for electrical communication.

Figure 3:
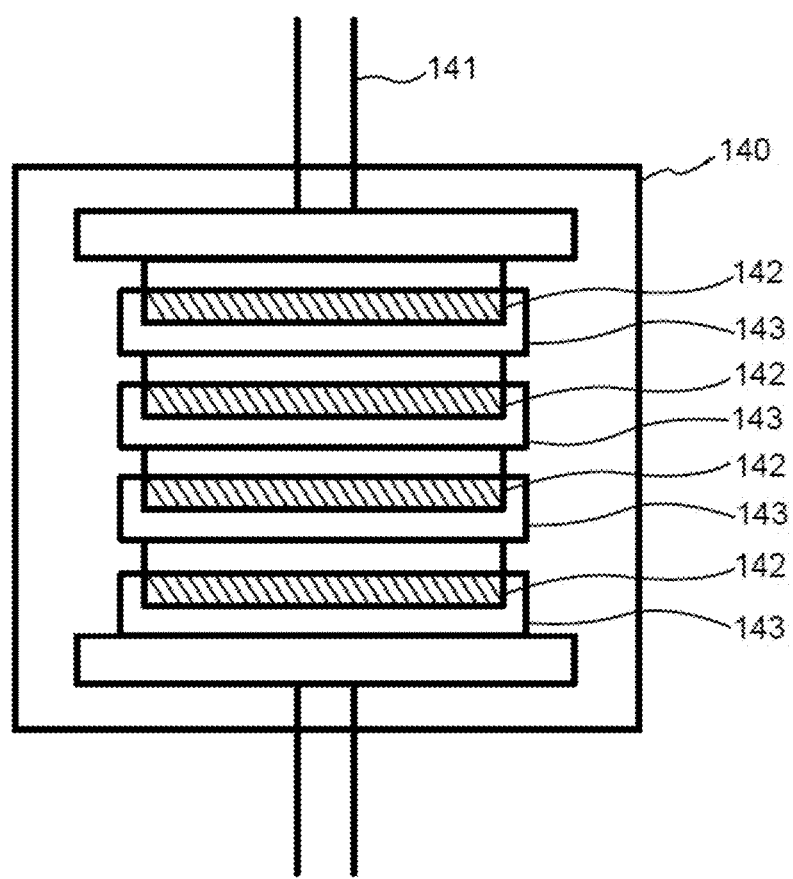
FIG. 3 is a sketch of a high temperature press and oven for a plurality of plates according to some embodiments of the present invention.

Given the relatively flat nature of the plate, a plurality of plates 142 may be formed in a single process by stacking a plurality of plate molding fixtures 143 along the axial direction of the press 141 which resides within the process oven 140, as seen conceptually in FIG. 3. The shafts may also be formed in a similar process using the press in the process oven.

In the overall process of manufacturing a heater pedestal used in semiconductor processing both the step of forming plates and forming shafts require significant commitments of time and energy. Given the cost of the specialized high temperature ovens with physical presses, and that the process steps of forming the plates and forming the shafts each may require the use of a specialized process oven for days, a considerable investment of both time and money has been invested just to get the overall process to the point where the shaft and plate have been completed. Yet a further step in the specialized process oven is required in present processes to affix the plate to the shaft. An example of this step would be to join the shaft to the plate using a liquid phase sintering step in the specialized high temperature process oven with a press. This third step in the specialized process oven also requires significant space in such a process oven as the assembled configuration of the heater includes both the length of the shaft and the diameter of the plate. Although the manufacture of just the shafts may take a similar amount of axial length, the diameter of the shafts is such that multiple shafts may be produced in parallel in a single process.

Figure 4:
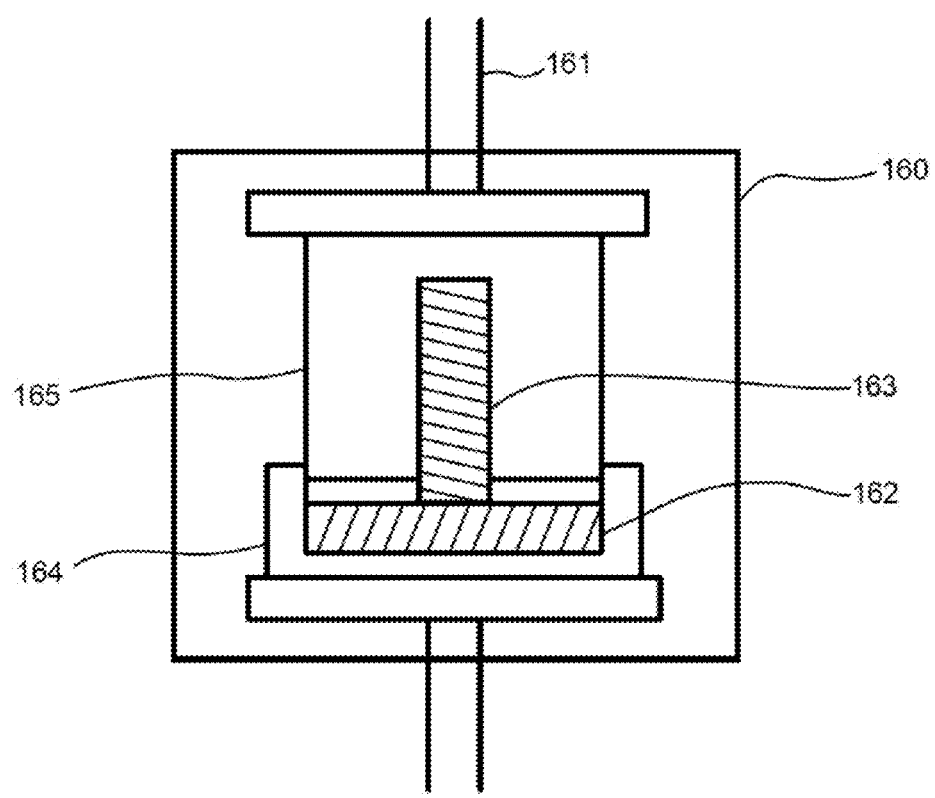
FIG. 4 is a sketch of a high temperature press and oven for a plate and shaft device.

As seen in FIG. 4, the joining process to sinter the shaft to the plate again requires the use of a process oven 160 with a press 161. A set of fixturing 164, 165 is used to position the plate 162 and the shaft 163, and to transmit the pressure delivered by the press 161.

Once the heater pedestal is completed, it may be used in semiconductor processing. The heater pedestal is likely to be used in harsh conditions, including corrosive gasses, high temperatures, thermal cycling, and gas plasmas. In addition, the heater pedestal may be subject to inadvertent impacts. Should the plate or the shaft become damaged, there have been limited opportunities for repair these devices.

Figure 5:
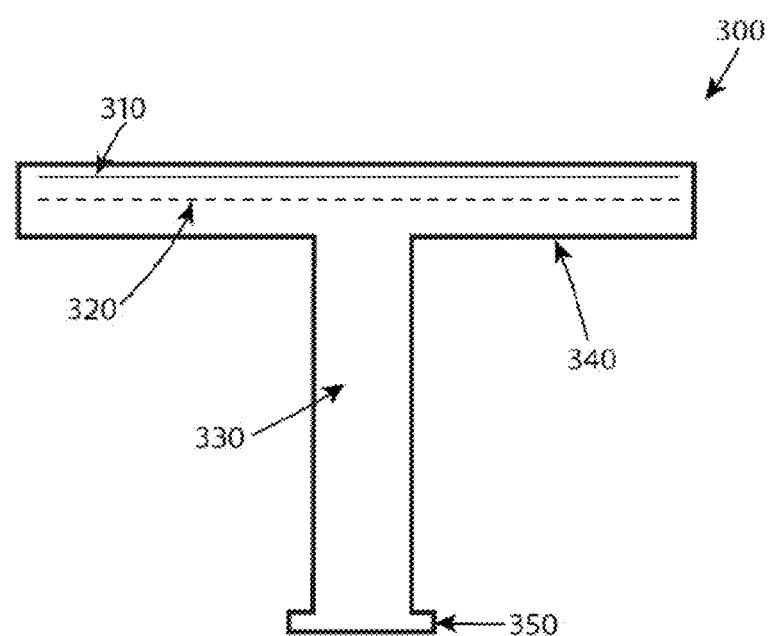
FIG. 5 is view of a plate and shaft device according to some embodiments of the present invention.

FIG. 5 shows one embodiment of a schematic illustration of a heater pedestal column used in a semiconductor processing chamber. The heater pedestal 300, which may be a ceramic heater pedestal, can include a radio frequency antenna 310, a heater element 320, a shaft 330, a plate 340, and a mounting flange 350. The radio frequency antenna 310 may be very close to the top surface of mounting plate.

Figure 6:
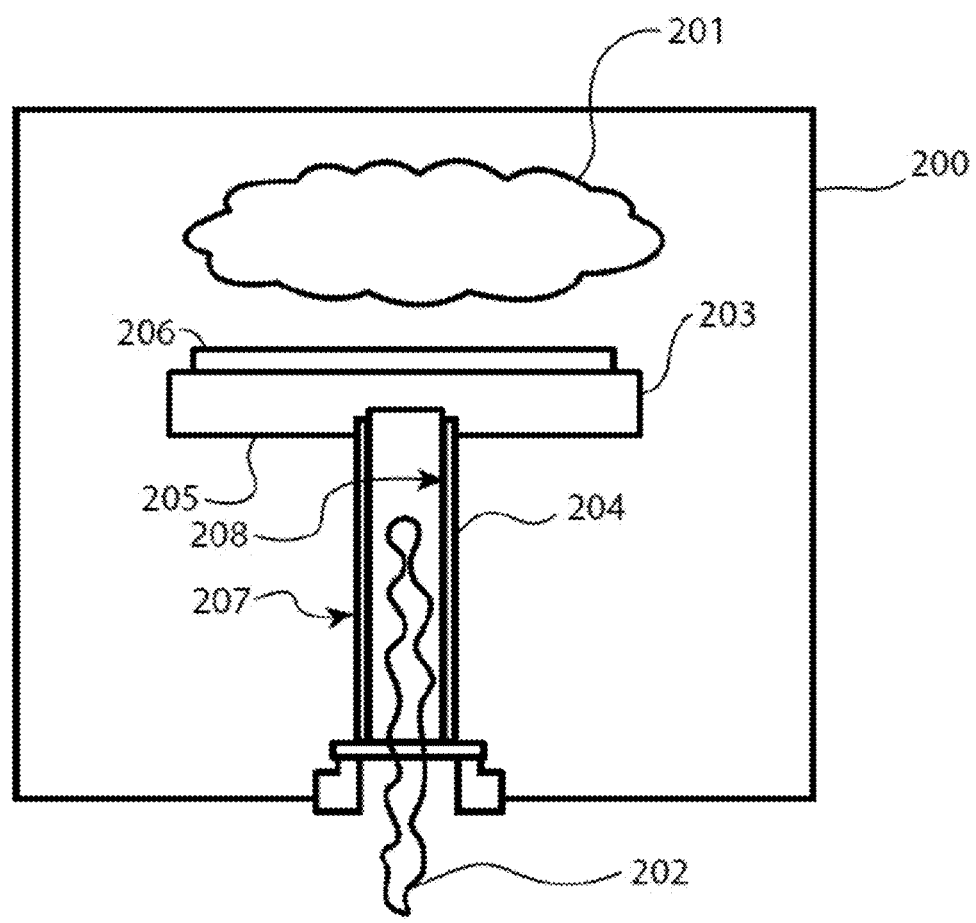
FIG. 6 is a partial cross-sectional view of a plate and shaft device in use in semiconductor manufacturing according to some embodiments of the present invention.

As seen in FIG. 6, the substrate support pedestal may bridge between two distinct atmospheres, both of which may present significant problems for prior brazing materials. On an external surface 207 of the semiconductor processing equipment, such as a heater 205, the materials must be compatible with the processes occurring in, and the environment 201 present in, the semiconductor processing chamber 200 in which the heater 205 will be used. These may include fluorine chemistries, and other extremely volatile, or corrosive, chemistries. The heater 205 may have a substrate 206 affixed to a top surface of the plate 203, which is supported by a shaft 204. On an internal surface 208 of the heater 205, the materials must be compatible with a different atmosphere 202, which may be an oxygenated atmosphere. Materials containing copper, silver, or gold may interfere with the lattice structure of the silicon wafer being processed, and are thus not appropriate. For any repairs which may use brazing as part of the repair process, the braze material may be exposed to an oxygenated atmosphere within the center of the hollow shaft. The portion of the braze joint which would be exposed to this atmosphere will oxidize, and may oxidize into the joint, resulting in a failure of the hermeticity of the joint. In addition to structural attachment, braze materials used in the area of the shaft and the plate of these devices to be used in semiconductor manufacturing must be hermetic in many, if not most or all, uses.

In an exemplary embodiment, the plate and shaft may both be of aluminum nitride. The plate may be approximately 9-13 inches in diameter and 0.5 to 0.75 inches thick in some embodiments. The shaft may be a hollow cylinder which is 5-10 inches long with a wall thickness of 0.1 inches.

Figure 7:
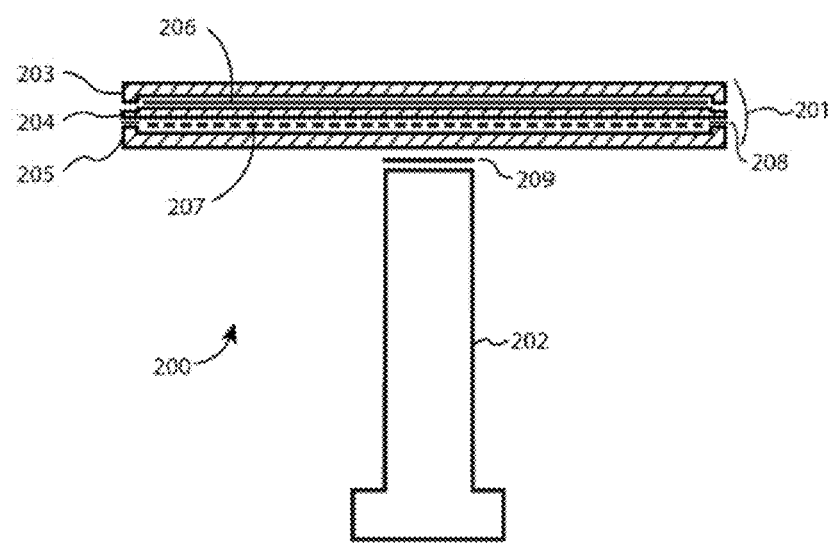
FIG. 7 is a partial cross-sectional view of a plate and shaft device according to some embodiments of the present invention.

In some embodiments of the present invention, as seen in expanded view in FIG. 7, a plate and shaft device 200 is seen with a plate assembly 201 and a shaft 202. The plate assembly 201 has layers 203, 204, 205. The top plate layer 203 overlays the middle layer 204 with an electrode layer 206 residing between the top plate layer 203 and the middle layer 204. The middle layer 204 overlays the bottom layer 205 with a heater layer 207 residing between the middle layer 204 and the bottom layer 205.

The layers 203, 204, 205 of the plate assembly 201 may be of a ceramic such as aluminum nitride in the case of a heater, or other materials including alumina, doped alumina, AlN, doped AlN, beryllia, doped beryllia and others in the case of an electrostatic chuck. Although the layers 203, 204, 205 of the plate assembly may be seen as separated in FIG. 7, in practice the layers may all be part of a solid ceramic piece, where in all of the components, including the shaft, the plate layers, the heater, and the electrode, were assembled together during the hot pressing of the ceramic. A substrate support pedestal will then typically have a ceramic top surface, with either a heater, or an RF antenna, or a clamping electrode underneath that top surface. The substrate support pedestal may have been designed such that the thickness of the top surface, above the next lower portion (heater, etc.), is an important aspect of the design.

When the top surface of the substrate support pedestal becomes damaged, the pedestal may only be of further utility if the top surface is repaired. In some aspects, the top surface may be repaired by grinding down the top surface to reduce or remove the imperfections. A limitation on this approach is that the top surface may already be very thin, sometimes as thin as 0.006 inches, and there may not be sufficient material to allow for grinding enough to remove the flaws. Another limitation on this approach is that when the top surface is ground, the overall thickness of the top surface is less than the thickness of the original top surface layer, and this may result in less than optimal performance of the substrate support pedestal.

In some embodiments of the present invention, damaged material on the top of the substrate support pedestal is ground down using methods such as using a rotary table with diamond bits. The pedestal top surface may ground down through some of the top ceramic layer, or may go further into features embedded within the ceramic. In some embodiments, the grinding may remove an RF antenna. A new top sheet may then be attached to the ground surface of the substrate support pedestal by brazing with a material which will attach the top sheet with a hermetic seal, and using a braze material that will not be adversely affected by the environments the pedestal may be subjected to, as discussed above. In some embodiments, the braze layer is used simply to attach the new top surface sheet of the pedestal. In some embodiments, the braze layer replaces, and functions as, an RF antenna. The new top sheet may initially be thicker than desired in the final product to limit handling damage, and damage during installation. The top layer may then be ground down to give the finished pedestal a dimension equal to the original pedestal, or equal with regard to significant parameters, such as the depth of the top surface above the embedded heater.

In some aspects, it may be important that the brazing layer which attaches the new ceramic top layer to the pedestal deliver a hermetic joint. When the top surface of the original pedestal is ground down, aspects may be brought to the surface which cannot tolerate the environment inside the chamber where the pedestal will later be used in the manufacture of semiconductors. Also, good and complete wetting, and hermeticity, are desired to eliminate any virtual leaks, wherein a non-hermetic braze layer may "leak" gasses trapped in voids in the braze, into the chamber where the pedestal is later used. This is not a desirable condition. Further, a non-voided, fully wetted, hermetic joint will provide a more consistent, even, thermal path, with more equal thermal conductivity, between the embedded heater and the top surface of the pedestal.

In an exemplary embodiment a substrate support pedestal with some damage to its top surface is ready for repair. The top surface is ground down through the ceramic and down to the RF antenna. In some embodiments, the depth of the RF antenna is known with sufficient accuracy that the machining may be set to go down to a known depth of cut. Once the RF antenna is exposed, the machining may continue until RF antenna is removed. The lead pads of the RF antenna, which may have been previously attached to leads coming from below the RF antenna, may be seen, indicating the location of the leads. The same leads that coupled to the RF antenna will remain as the leads to the replaced RF antenna. A brazing layer, of aluminum and as discussed below, may be placed, or deposited, on the top of the machined pedestal. A new ceramic top layer, which may be AlN in some aspects, is then placed on the pre-assembly. The pre-assembly may then be placed in a process oven, which may be a vacuum chamber. The assembly is then brazed together. After brazing the new ceramic top layer may be machined to give the pedestal a desired height, which may be the original height of the pedestal.

In an exemplary embodiment, the top layer of the pedestal is aluminum nitride, as is the new ceramic top layer. The brazing layer is 99.9% aluminum and was deposited onto the pedestal, and is 30 microns thick. In some embodiments, the brazing layer may be aluminum foil and may be 15-200 microns thick prior to brazing. The new ceramic top layer may be 0.125 inches thick during installation and brazing, and then machined down to 0.040 inches. The brazing is done for 10 minutes at 850 C. The brazing is done at a pressure lower than 1×10E-4 Torr.

In some embodiments, the new ceramic top layer may be brazed to the pedestal at 800 C for 2 minutes to 10 minutes. In some embodiments, the new ceramic top layer may be brazed to the pedestal at 800 C for 10 minutes to 100 minutes. In some embodiments, the new ceramic top layer may be brazed to the pedestal at 1200 for 2 minutes to 100 minutes. In some embodiments, the new ceramic top layer may be brazed to the pedestal at 770 C for 2 minutes to 10 minutes. In some embodiments, the new ceramic top layer may be brazed to the pedestal at 770 C for 10 minutes to 100 minutes. In some embodiments, the new ceramic top layer may be brazed to the pedestal at 1200 for 2 minutes to 100 minutes. When rounded to the nearest 50 C increment, the minimum temperature required may be 800 C. When rounded to the nearest 10 C increment, the minimum temperature required may be 770 C.

In some embodiments of the present invention, damaged material on the top of the substrate support pedestal is ground down using methods such as using a rotary table with diamond bits. The pedestal top surface may ground down through some of the top ceramic layer, or may go further into features embedded within the ceramic. In some embodiments, the grinding may remove a clamping electrode. A new top sheet may then be attached to the ground surface of the substrate support pedestal by brazing with a material which will attach the top sheet with a hermetic seal, and using a braze material that will not be adversely affected by the environments the pedestal may be subjected to, as discussed above. In some embodiments, the braze layer replaces, and functions as, a clamping electrode. The new top sheet may initially be thicker than desired in the final product to limit handling damage, and damage during installation. The top layer may then be ground down to give the finished pedestal a dimension equal to the original pedestal, or equal with regard to significant parameters, such as the depth of the top surface above the embedded heater, or to facilitate electrostatic grip of the substrate.

In some aspects, it may be important that the brazing layer which attaches the new ceramic top layer to the pedestal deliver a hermetic joint. When the top surface of the original pedestal is ground down, aspects may be brought to the surface which cannot tolerate the environment inside the chamber where the pedestal will later be used in the manufacture of semiconductors. Also, good and complete wetting, and hermeticity, are desired to eliminate any virtual leaks, wherein a non-hermetic braze layer may "leak" gasses trapped in voids in the braze, into the chamber where the pedestal is later used. This is not a desirable condition. Further, a non-voided, fully wetted, hermetic joint will provide a more consistent, even, thermal path, with more equal thermal conductivity, between the embedded heater and the top surface of the pedestal.

In an exemplary embodiment a substrate support pedestal with some damage to its top surface is ready for repair. The top surface is ground down through the ceramic and down to the clamping electrode. In some embodiments, the depth of the clamping electrode is known with sufficient accuracy that the machining may be set to go down to a known depth of cut. Once the clamping electrode is exposed, the machining may continue until clamping electrode is removed. The lead pads of the clamping electrode, which may have been previously attached to leads coming from below the clamping electrode, may be seen, indication the location of the leads. The same leads that coupled to the clamping electrode will remain as the leads to the replaced clamping electrode. A brazing layer, of aluminum and as discussed below, may be placed, or deposited, on the top of the machined pedestal. A new ceramic top layer, which may be AlN in some aspects, is then placed on the pre-assembly. The pre-assembly may then be placed in a process oven, which may be a vacuum chamber. The assembly is then brazed together. After brazing the new ceramic top layer may be machined to give the pedestal a desired height, which may be the original height of the pedestal.

In an exemplary embodiment, the top layer of the pedestal is aluminum nitride, as is the new ceramic top layer. The brazing layer is 99.9% aluminum and was deposited onto the pedestal, and is 30 microns thick. In some embodiments, the brazing layer may be aluminum foil and may be 15-200 microns thick prior to brazing. The new ceramic top layer may be 0.125 inches thick during installation and brazing, and then machined down to 0.008 to 0.040 inches, for example. The brazing is done for 10 minutes at 850 C. The brazing is done at a pressure lower than 1×10E-4 Torr.

In some embodiments, the new ceramic top layer may be brazed to the pedestal at 800 C for 2 minutes to 10 minutes. In some embodiments, the new ceramic top layer may be brazed to the pedestal at 800 C for 10 minutes to 100 minutes. In some embodiments, the new ceramic top layer may be brazed to the pedestal at 1200 for 2 minutes to 100 minutes. In some embodiments, the new ceramic top layer may be brazed to the pedestal at 770 C for 2 minutes to 10 minutes. In some embodiments, the new ceramic top layer may be brazed to the pedestal at 770 C for 10 minutes to 100 minutes. In some embodiments, the new ceramic top layer may be brazed to the pedestal at 1200 for 2 minutes to 100 minutes. When rounded to the nearest 50 C increment, the minimum temperature required may be 800 C. When rounded to the nearest 10 C increment, the minimum temperature required may be 770 C.

In some embodiments of the present invention, damaged material on the top of the substrate support pedestal is ground down using methods such as using a rotary table with diamond bits. The pedestal top surface may ground down through some of the top ceramic layer, or may go further into features embedded within the ceramic. In some embodiments, the grinding may remove only ceramic above a heater. A new top sheet may then be attached to the ground surface of the substrate support pedestal by brazing with a material which will attach the top sheet with a hermetic seal, and using a braze material that will not be adversely affected by the environments the pedestal may be subjected to, as discussed above. In some embodiments, the braze layer is used simply to attach the new top surface sheet of the pedestal. The new top sheet may initially be thicker than desired in the final product to limit handling damage, and damage during installation. The top layer may then be ground down to give the finished pedestal a dimension equal to the original pedestal, or equal with regard to significant parameters, such as the depth of the top surface above the embedded heater, or to facilitate electrostatic grip of the substrate.

In some aspects, it may be important that the brazing layer which attaches the new ceramic top layer to the pedestal deliver a hermetic joint. When the top surface of the original pedestal is ground down, aspects may be brought to the surface which cannot tolerate the environment inside the chamber where the pedestal will later be used in the manufacture of semiconductors. Also, good and complete wetting, and hermeticity, are desired to eliminate any virtual leaks, wherein a non-hermetic braze layer may "leak" gasses trapped in voids in the braze, into the chamber where the pedestal is later used. This is not a desirable condition. Further, a non-voided, fully wetted, hermetic joint will provide a more consistent, even, thermal path, with more equal thermal conductivity, between the embedded heater and the top surface of the pedestal.

In an exemplary embodiment a substrate support pedestal with some damage to its top surface is ready for repair. The top surface is ground down through the ceramic to a distance above the heater. In order not to damage the heater, the target residual ceramic above the heater may be 0.100 inches. A brazing layer, of aluminum and as discussed below, may be placed, or deposited, on the top of the machined pedestal. A new ceramic top layer, which may be AlN in some aspects, is then placed on the pre-assembly. The pre-assembly may then be placed in a process oven, which may be a vacuum chamber. The assembly is then brazed together. After brazing the new ceramic top layer may be machined to give the pedestal a desired height, which may be the original height of the pedestal.

In an exemplary embodiment, the top layer of the pedestal is aluminum nitride, as is the new ceramic top layer. The brazing layer is 99.9% aluminum and was deposited onto the pedestal, and is 30 microns thick. In some embodiments, the brazing layer may be aluminum foil and may be 15-200 microns thick prior to brazing. The new ceramic top layer may be 0.125 inches thick during installation and brazing, and then machined down to 0.040 to 0.060 inches, for example. The brazing is done for 10 minutes at 850 C. The brazing is done at a pressure lower than 1×10E-4 Torr.

In some embodiments, the new ceramic top layer may be brazed to the pedestal at 800 C for 2 minutes to 10 minutes. In some embodiments, the new ceramic top layer may be brazed to the pedestal at 800 C for 10 minutes to 100 minutes. In some embodiments, the new ceramic top layer may be brazed to the pedestal at 1200 for 2 minutes to 100 minutes.

Figure 8:
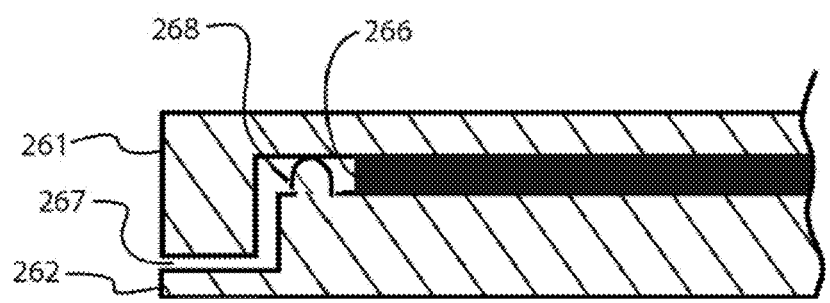
FIG. 8 is a partial cross-sectional view of a new top ceramic layer according to some embodiments of the present invention.

FIG. 8 illustrates a cross-section of a pedestal top plate 260 according to some embodiments of the present invention. The pedestal top plate 260 is a multi-layer plate assembly with both a heater and an electrode residing between different layers. The new top layer is joined with a brazing element 266. In some embodiments, the final position of the new top plate layer in a direction perpendicular to the plane of the plates is dictated by standoffs 268 on the plates.

A new ceramic top layer 261 overlays a lower portion 262. The top plate layer 261 is joined to the lower portion 262 using a multi-function joining layer 266. The multi-function joining layer 266 is adapted to provide joining of the new ceramic top layer 261 to the lower plate portion 262 and to be an electrode. Such an electrode may be a joining layer that is substantially a circular disc, wherein the joining material also functions as an electrode. As seen in FIG. 36, a standoff 268 is adapted to provide positional control of the top plate layer 261 to the lower plate layer 262 in a vertical direction perpendicular to the primary plane of the plate layers. In some embodiments, the brazing layer may be so thin that positional control is not needed or implemented. The rim of the top plate layer 261 is adapted to remove line of sight along the boundary 267 between the two plates at their periphery. The thickness of the joining layer 266 may be sized such that the joining layer 266 is in contact with the top plate layer 261 and the lower plate layer 262 prior to the step of heating and joining the plate assembly.

During a joining step of the plate assembly to join the new ceramic top layer, the components as seen in FIG. 8 may be pre-assembled, and then this plate pre-assembly may be joined using processes described herein to form a completed repaired substrate support pedestal.

Figure 15:
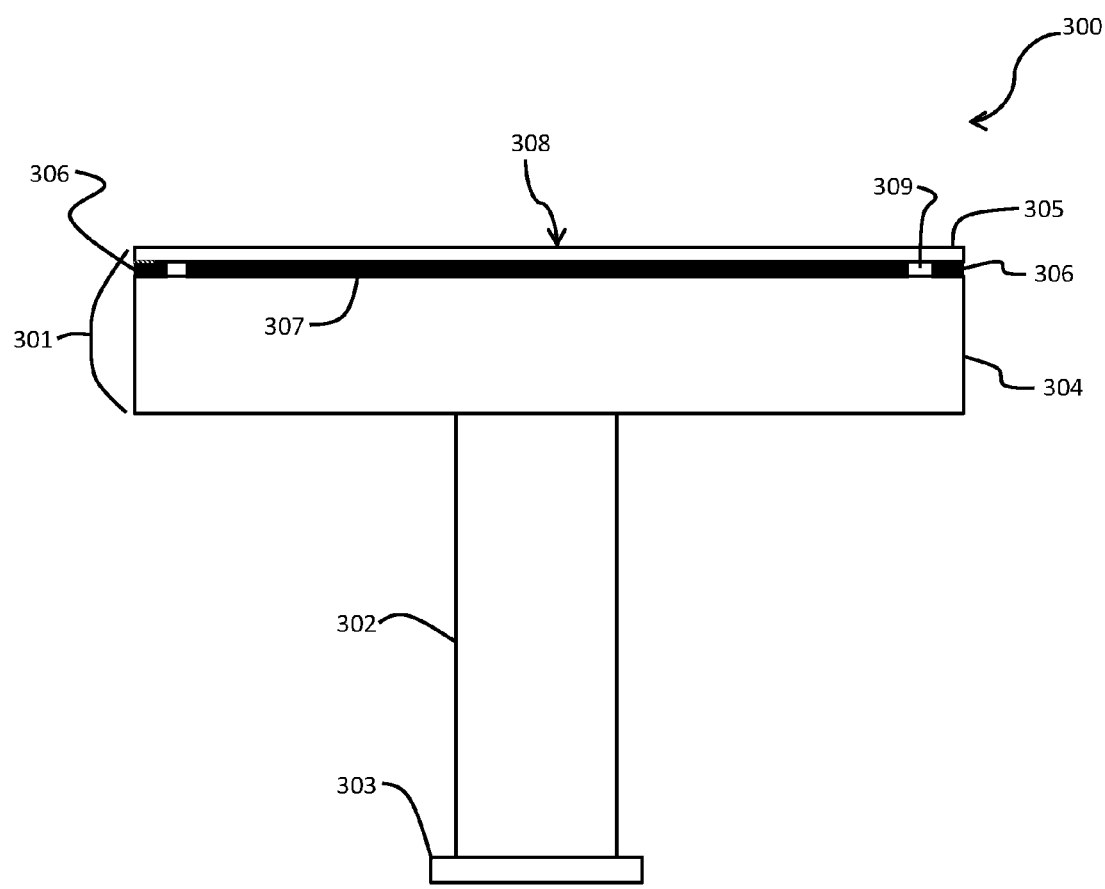
FIG. 15 is an illustrative view of a pedestal with a perimeter sealing ring according to some embodiments of the present invention.

In some embodiments of the present invention, as seen in FIG. 15, an electrostatic chuck 300 may have a plate assembly 301 joined to a shaft 302. The shaft 302 may be hollow and may have a mounting flange 303. The plate assembly 301 has a new top surface 308 adapted to support a wafer or other substrate during processing. The new top layer 305 may be joined to the joined to a lower plate portion 304 using a braze layer 306. A clamping electrode 307 may reside between the top layer 305 and the lower plate portion 304. The clamping electrode 307 may be separated from a braze layer 306 by a gap 309 in order to provide electrical isolation of the electrode from the chamber.

Figure 16:
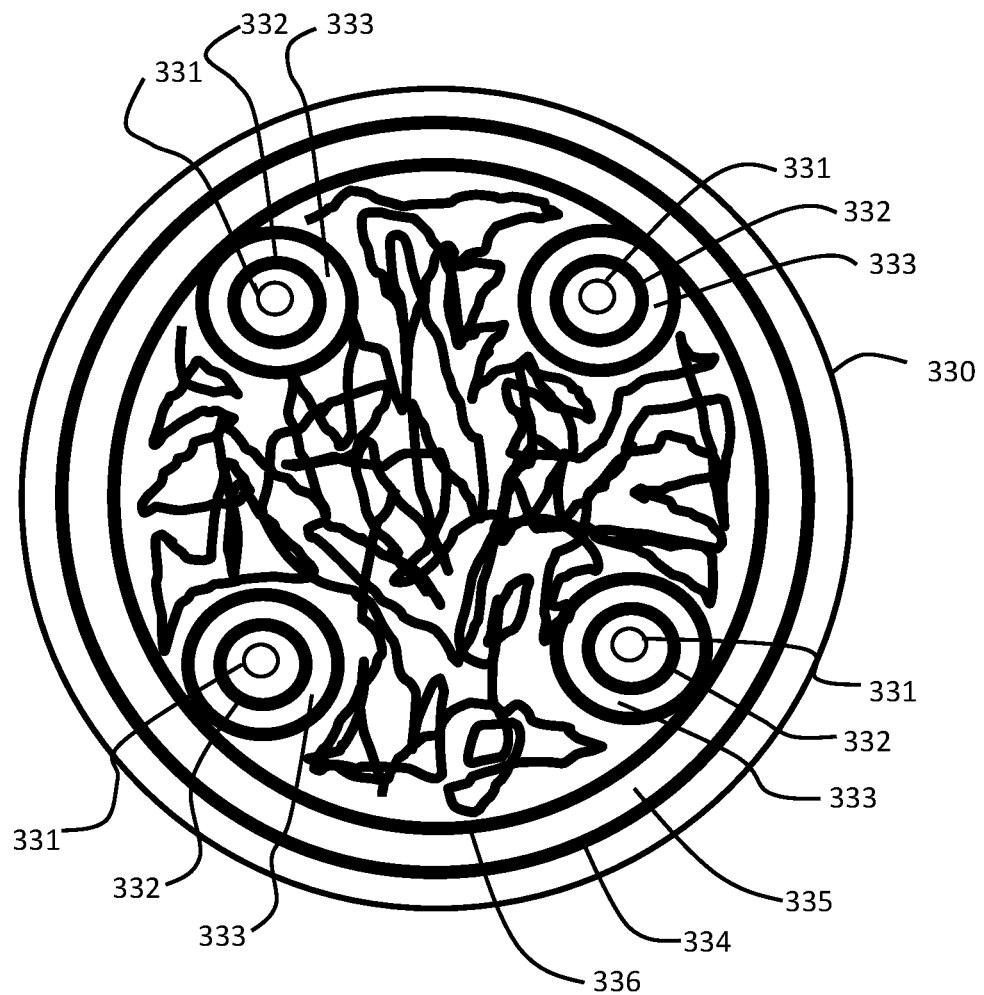
FIG. 16 is an illustrative sectional view according to some embodiments of the present invention.

FIG. 16 illustrates aspects of a clamping electrode 336 as may be used with an electrostatic chuck having pins for removal of the substrate. FIG. 16 may be seen as a vertical sectional view through the first sealing ring 334 between the upper plate layer and the middle plate layer. The clamping electrode 336 is adapted to provide clamping force to the substrate supported by the electrostatic chuck. A first sealing ring 334 is seen around the circumferential perimeter of the plate layer 330. A gap 333 between the first sealing ring 334 and the clamping electrode 336 provides electrical isolation via a gap 335. Pin holes 331 each have sealing rings 332 around their perimeter. The sealing rings 332 have gaps 333 between the sealing rings 332 and the clamping electrode 336.

The joining methods according to some embodiments of the present invention rely on control of wetting and flow of the joining material relative to the ceramic pieces to be joined. In some embodiments, the absence of oxygen during the joining process allows for proper wetting without reactions which change the materials in the joint area. With proper wetting and flow of the joining material, a hermetically sealed joint can be attained at a low temperature relative to liquid phase sintering, for example.

In some applications where end products of joined ceramics are used, strength of the joint may not be the key design factor. In some applications, hermeticity of the joint may be required to allow for separation of atmospheres on either side of the joint. In some applications, hermeticity of the joint may be required to prevent virtual leaks of the braze layer. Also, the composition of the joining material may be important such that it is resistant to chemicals which the ceramic assembly end product may be exposed to. The joining material may need to be resistant to the chemicals, which otherwise might cause degeneration of the joint, and loss of the hermetic seal. The joining material may also need to be of a type of material which does not negatively interfere with the processes later supported by the finished ceramic device.

Figure 9:
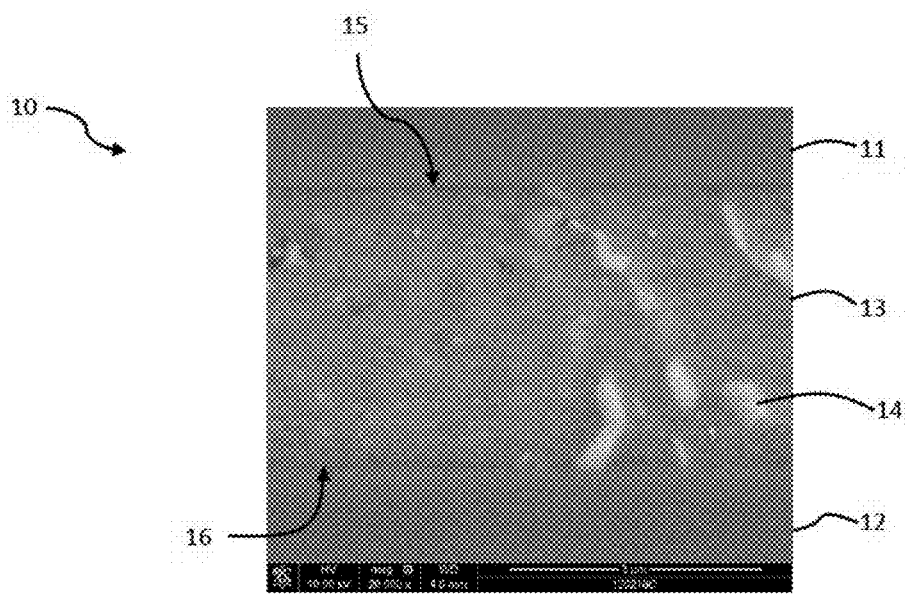
FIG. 9 is a SEM cross-sectional view of a joint according to some embodiments of the present invention.

FIG. 9 is a view of a cross-section of a joint 10 according to some embodiments of the present invention. The image is a as seen through a Scanning Electron Microscope (SEM), and is taken at 20,000× magnification. A first ceramic piece 11 has been joined to a second ceramic piece 12 with a joining layer 13. In this exemplary embodiment, the first ceramic piece and second ceramic piece are made of monocrystalline aluminum nitride (AlN). The joining layer began as aluminum foil with 0.4 Wt. % Fe. The joining temperature was 1200 C and was held for 120 minutes. The joining was done under a vacuum of 7.3×10E-5 Torr, with a physical contact pressure across the joint of approx. 290 psi during joining.

The discussion below involves examples of brazing processes which result in hermetic joints. FIG. 1 illustrates the joint with an upper boundary 15 between the first ceramic piece 11 and the joining layer 13, and a lower boundary 16 between the joining layer 13 and the second ceramic piece 12. As seen at the boundary regions at 20,000× magnification, no diffusion is seen of the joining layer into the ceramic pieces. No evidence of reaction within the ceramics is seen. The boundaries do not show any evidence of voids and do indicate that there was complete wetting of the boundaries by the aluminum during the joining process. The bright spots 14 seen in the joining layer are an aluminum-iron compound, the iron being a residue from the foil used for the joining layer.

Figure 10:
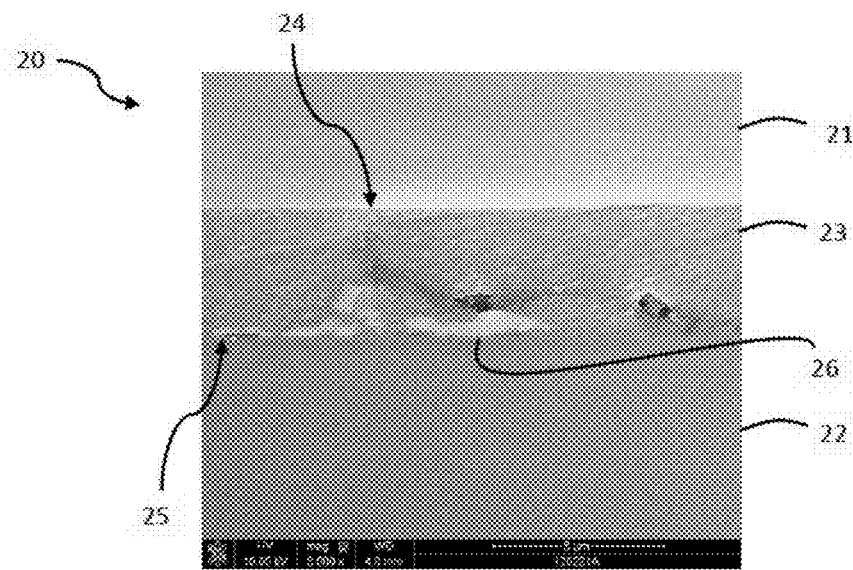
FIG. 10 is a SEM cross-sectional view of a joint according to some embodiments of the present invention.

FIG. 10 is a view of a cross-section of a joint 20 according to some embodiments of the present invention. The view is as seen through a Scanning Electron Microscope (SEM), and is at 8,000× magnification. A first ceramic piece 21 has been joined to a second ceramic piece 22 with a joining layer 23. In this exemplary embodiment, the first ceramic piece and second ceramic piece are made of mono-crystalline aluminum nitride (AlN). The joining layer began as aluminum foil with 0.4 Wt. % Fe. The joining temperature was 900 C and was held for 15 minutes. The joining was done under a vacuum of 1.9×10E-5 Torr, with a minimal physical contact pressure across the joint during joining. The joining layer 23 illustrates that after the joining of the first ceramic piece 21 and the second piece 22 a residual layer of aluminum remains between the joined pieces.

FIG. 10 illustrates the joint with an upper boundary 24 between the first ceramic piece 21 and the joining layer 23, and a lower boundary 25 between the joining layer 23 and the second ceramic piece 22. As seen at the boundary regions at 8,000× magnification, no diffusion is seen of the joining layer into the ceramic pieces. No evidence of reaction within the ceramics is seen. The boundaries do not show any evidence of voids and do indicate that there was complete wetting of the boundaries by the aluminum during the joining process. The bright spots 26 seen in the joining layer contain Fe residue from the foil used for the joining layer.

FIGS. 9 and 10 illustrate joints according to embodiments of the present invention in which ceramics, such as mono-crystalline aluminum nitride, are joined with a joining layer of aluminum that achieved full wetting during the joining process. The joints show no evidence of diffusion of the joining layer into the ceramic, and no evidence of reaction areas within the joining layer or in the ceramic pieces. There is no evidence of a chemical transformation within the ceramic pieces or the joining layer. There is a residual layer of aluminum present after the joining process.

Figure 11:
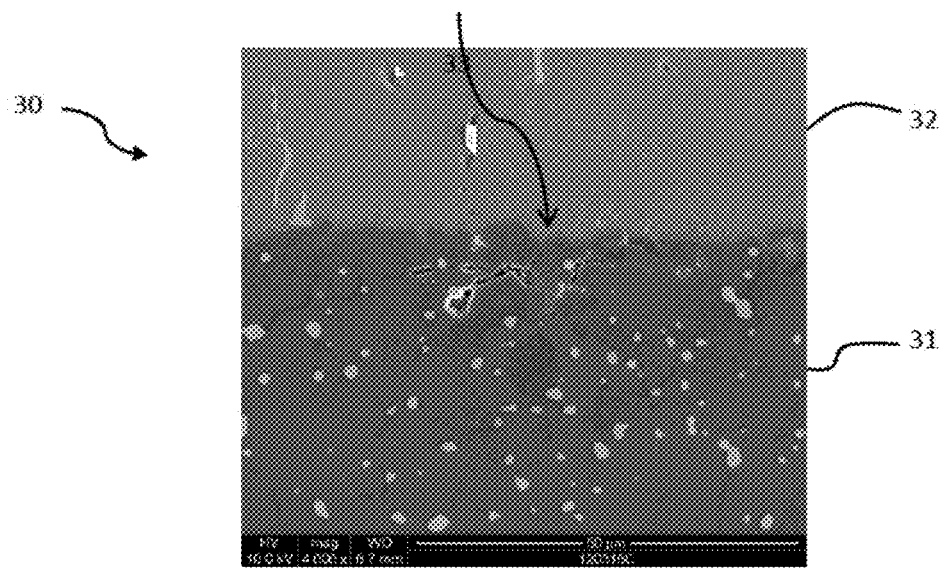
FIG. 11 is a SEM cross-sectional view of a joint according to some embodiments of the present invention.

FIG. 11 illustrates a joint 30 according to embodiments of the present invention using a polycrystalline aluminum nitride ceramic. In FIG. 3, the joining layer 32 is seen joined to the lower ceramic piece 31. The view is as seen through a Scanning Electron Microscope (SEM), and is at 4,000× magnification. In this exemplary embodiment, the first ceramic piece is made of poly-crystalline aluminum nitride (AlN). The joining layer began as aluminum foil with 0.4 Wt. % Fe. The joining temperature was 1200 C and was held for 60 minutes. The joining was done under a vacuum of 2.4×10E-5 Torr, with a physical contact pressure across the joint during joining of approximately 470 psi.

Figure 12:
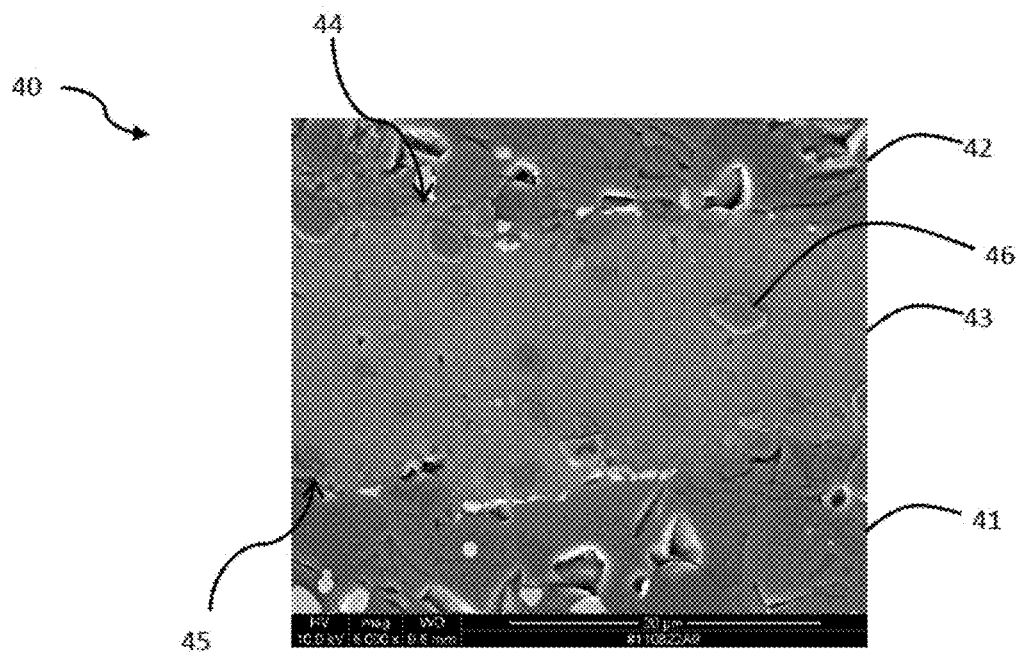
FIG. 12 is a SEM cross-sectional view of a joint according to some embodiments of the present invention.
Figure 13:
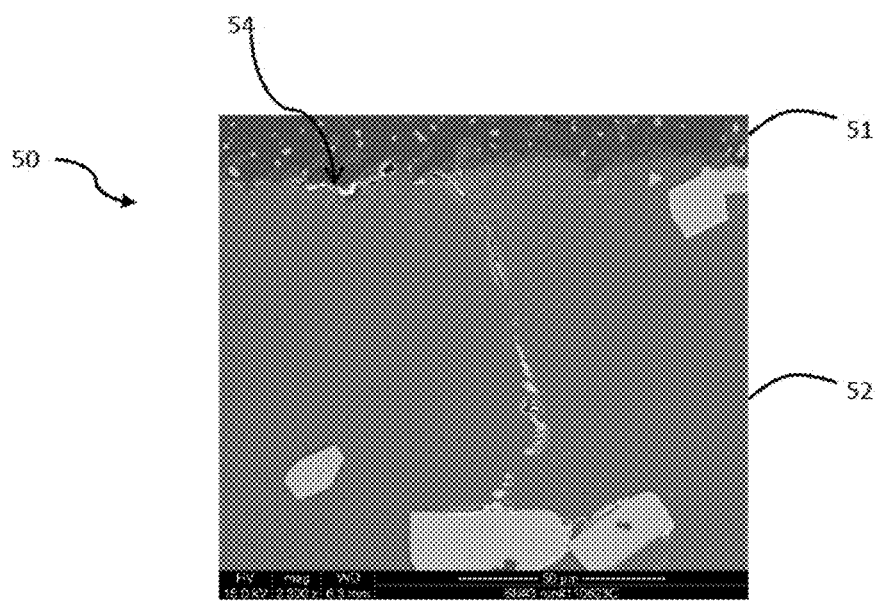
FIG. 13 is a SEM cross-sectional view of a joint according to some embodiments of the present invention.

In some embodiments, the poly-crystalline AlN, such as the ceramic seen in FIGS. 11-13, is comprised of 96% AlN and 4% Yttria. Such a ceramic may be used in industrial applications because during the liquid phase sintering used to manufacture the ceramic, a lower temperature may be used. The lower temperature process, in contrast to mono-crystalline AlN, reduces manufacturing energy consumption and costs of the ceramic. The poly-crystalline material may also have preferred properties, such as being less brittle. Yttria and other dopants, such as Sm2O3, are often used for manufacturability and tuning of material properties.

FIG. 11 illustrates the same lack of diffusion at the boundary 33 between the joining layer 32 and the first ceramic piece 31, which is a poly-crystalline AlN ceramic, as was seen with the mono-crystalline examples seen in FIGS. 1 and 2. Although the boundary 33 may appear to be somewhat rougher than seen in FIGS. 1 and 2, this is a result of a rougher original surface. No diffusion is seen along the boundary.

With a poly-crystalline AlN such as the 96% AlN-4% Yttria ceramic as seen in FIGS. 11-13, the ceramic presents grains of AlN which are interspersed with yttrium aluminate. When this ceramic is presented with aluminum, such as joining layers according to some embodiments of the present invention, at higher temperature such as above the liquidus temperature of Al, the Al brazing material may react with the yttrium aluminate resulting in the dislodging and release of some of the AlN grains at the surface of the ceramic.

FIG. 12 illustrates a joint 40 according to embodiments of the present invention using a polycrystalline aluminum nitride ceramic. In FIG. 4, the joining layer 43 is seen joining the upper ceramic piece 42 to the lower ceramic piece 41. The view is as seen through a Scanning Electron Microscope (SEM), and is at 8,000× magnification. In this exemplary embodiment, the first ceramic piece is made of poly-crystalline aluminum nitride (AlN). The joining layer began as aluminum foil with 99.8% Al. The joining temperature was 1120 C and was held for 60 minutes. The joining was done under a vacuum of 2.0×10E-5 Torr, with a minimal physical contact pressure across the joint during joining.

FIG. 12 illustrates some grains 46 of AlN within the joining layer 43. The grains 46 have migrated from the surface 44 of the upper ceramic piece 42 and/or the surface 45 of the lower ceramic piece 41. The AlN grains have been dislodged from the surface due to the aluminum of the joining layer having attacked the yttrium aluminate between the grains of the poly-crystalline AlN. The AlN grains themselves have not reacted with the aluminum joining layer, nor is any sign of diffusion of the aluminum into the AlN grains seen. The non-susceptibility of AlN to diffusion with aluminum under the conditions of processes according to embodiments of the present invention had been previously seen in the examples of mono-crystalline AlN of FIGS. 1 and 2, and is maintained in the poly-crystalline example of FIG. 4.

FIG. 13 illustrates a joint 50 according to embodiments of the present invention using a poly-crystalline aluminum nitride ceramic. In FIG. 5, the joining layer 52 is seen joined to the upper ceramic piece 51. The view is as seen through a Scanning Electron Microscope (SEM), and is at 2,300× magnification. In this exemplary embodiment, the first ceramic piece 51 is made of poly-crystalline aluminum nitride (AlN). The joining layer began as aluminum powder with 5 Wt. % Zr. The joining temperature was 1060 C and was held for 15 minutes. The joining was done under a vacuum of 4.0×10E-5 Torr, with a physical contact pressure across the joint during joining of approximately 8 psi.

The joints as seen in the examples of FIGS. 1-5 may be used in applications where a hermetically sealed joint between ceramic pieces is required, such as when attaching a new top ceramic layer to a substrate support pedestal undergoing a repair process.

In some embodiments, standoffs may be used to create a minimum braze layer thickness for the joint. In other embodiments, the minimum braze layer thickness for the joint is created by incorporating powdered material into the braze layer filler material. The largest particle size of that incorporated powder material determines the minimum joint thickness. The powdered material may be mixed with powdered braze layer filler material, or painted onto the ceramic joint surface, or painted onto the braze layer filler foil of appropriate thickness, or incorporated directly into the braze layer filler material foil of appropriate thickness. In some embodiments, the braze layer material, prior to brazing, will be thicker than the distance maintained by the mesas or powder particles between the shaft end and the plate. In some embodiments, other methods may be used to establish a minimum braze layer thickness. In some embodiments, ceramic spheres may be used to establish a minimum braze layer thickness. In some aspects, the joint thickness may be slightly thicker than the dimension of the standoffs, or other minimum thickness determining device, as not quite all of the braze material may be squeezed out from between the standoffs and the adjacent interface surface. In some aspects, some of the aluminum braze layer may be found between the standoff and the adjacent interface surface. In some embodiments, the brazing material may be aluminum sputtered onto the ceramic surface to a thickness of 0.0003 inches. In some embodiments, the brazing material may be 0.006 inches thick prior to brazing with a completed joint minimum thickness of 0.004 inches. The brazing material may be aluminum with 0.4 Wt. % Fe.

Aluminum has a property of forming a self-limiting layer of oxidized aluminum. This layer is generally homogenous, and, once formed, prevents or significantly limits additional oxygen or other oxidizing chemistries (such a fluorine chemistries) penetrating to the base aluminum and continuing the oxidation process. In this way, there is an initial brief period of oxidation or corrosion of the aluminum, which is then substantially stopped or slowed by the oxide (or fluoride) layer which has been formed on the surface of the aluminum. The braze material may be in the form of a sheet, a powder, a thin film, or be of any other form factor suitable for the brazing processes described herein. For example, the brazing layer may be a sheet having a thickness ranging from 0.00019 inches to 0.011 inches or more. In some embodiments, the braze material may be a sheet having a thickness of approximately 0.0012 inches. In some embodiments, the braze material may be a sheet having a thickness of approximately 0.006 inches. Typically, alloying constituents (such as magnesium, for example) in aluminum are formed as precipitates in between the grain boundaries of the aluminum. While they can reduce the oxidation resistance of the aluminum bonding layer, typically these precipitates do not form contiguous pathways through the aluminum, and thereby do not allow penetration of the oxidizing agents through the full aluminum layer, and thus leaving intact the self-limiting oxide-layer characteristic of aluminum which provides its corrosion resistance. In the embodiments of using an aluminum alloy which contains constituents which can form precipitates, process parameters, including cooling protocols, would be adapted to minimize the precipitates in the grain boundary. For example, in one embodiment, the braze material may be aluminum having a purity of at least 99.5%. In some embodiments, a commercially available aluminum foil, which may have a purity of greater than 92%, may be used. In some embodiments, alloys are used. These alloys may include Al-5 w % Zr, Al-5 w % Ti, commercial alloys #7005, #5083, and #7075. These alloys may be used with a joining temperature of 1100 C in some embodiments. These alloys may be used with a temperature between 800 C and 1200 C in some embodiments. These alloys may be used with a lower or higher temperature in some embodiments. When rounded to the nearest 50 C increment, the minimum temperature required may be 800 C. When rounded to the nearest 10 C increment, the minimum temperature required may be 770 C.

The non-susceptibility of AlN to diffusion with aluminum under the conditions of processes according to embodiments of the present invention results in the preservation of the material properties, and the material identity, of the ceramic after the brazing step in the manufacturing of the plate and shaft assembly.

In some embodiments, the joining process is performed in a process chamber adapted to provide very low pressures. Joining processes according to embodiments of the present invention may require an absence of oxygen in order to achieve a hermetically sealed joint. In some embodiments, the process is performed at a pressure lower than 1×10E-4 Torr. In some embodiments, the process is performed at a pressure lower than 1×10E-5 Torr. In some embodiments, further oxygen removal is achieved with the placement of zirconium or titanium in the process chamber. For example, a zirconium inner chamber may be placed around the pieces which are to be joined.

In some embodiments, atmospheres other than vacuum may be used to achieve a hermetic seal. In some embodiments, argon (Ar) atmosphere may be used to achieve hermetic joints. In some embodiments, other noble gasses are used to achieve hermetic joints. In some embodiments, hydrogen (H2) atmosphere may be used to achieve hermetic joints.

The wetting and flow of the brazing layer may be sensitive to a variety of factors. The factors of concern include the braze material composition, the ceramic composition, the chemical makeup of the atmosphere in the process chamber, especially the level of oxygen in the chamber during the joining process, the temperature, the time at temperature, the thickness of the braze material, the surface characteristics of the material to be joined, the geometry of the pieces to be joined, the physical pressure applied across the joint during the joining process, and/or the joint gap maintained during the joining process.

An example of a brazing method for joining together first and second ceramic objects may include the steps of bringing the first and second objects together with a brazing layer selected from the group consisting of aluminum and an aluminum alloy disposed between the first and second ceramic objects, heating the brazing layer to a temperature of at least 800 C, and cooling the brazing layer to a temperature below its melting point so that the brazing layer hardens and creates a hermetic seal so as to join the first member to the second member. Various geometries of braze joints may be implemented according to methods described herein. When rounded to the nearest 50 C increment, the minimum temperature required may be 800 C. When rounded to the nearest 10 C increment, the minimum temperature required may be 770 C.

Prior to joining, the new top sheet and the pedestal may be fixtured relative to each other to maintain some positional control while in the process chamber. The fixturing may also aid in the application of an externally applied load to create contact pressure between the two pieces, and across the joint, during the application of temperature. A weight may be placed on top of the fixture pieces such that contact pressure in applied across the joint. The weight may be proportioned to the area of the brazing layer. In some embodiments, the contact pressure applied across the joint may be in the range of approximately 2-500 psi onto the joint contact areas. In some embodiments the contact pressure may be in the range of 2-40 psi. In some embodiments, minimal pressure may be used. The fixtured assembly may then be placed in a process oven. The oven may be evacuated to a pressure of less than 5×10E-5 Torr. In some aspects, vacuum removes the residual oxygen. In some embodiments, a vacuum of lower than 1×10E-5 Torr is used. In some embodiments, the fixtured assembly is placed within a zirconium inner chamber which acts as an oxygen attractant, further reducing the residual oxygen which might have found its way towards the joint during processing. In some embodiments, the process oven is purged and re-filled with pure, dehydrated pure noble gas, such as argon gas, to remove the oxygen. In some embodiments, the process oven is purged and re-filled with purified hydrogen to remove the oxygen.

The fixture assembly is then subjected to increases in temperature, and a hold at the joining temperature. Upon initiating the heating cycle, the temperature may be raised slowly, for example 15 C per minute to 200 C and then 20 C per minute thereafter, to standardized temperatures, for example, 600 C and the joining temperature, and held at each temperature for a fixed dwell time to allow the vacuum to recover after heating, in order to minimize gradients and/or for other reasons. When the braze temperature has been reached, the temperature can be held for a time to effect the braze reaction. In an exemplary embodiment, the dwell temperature may be 800 C and the dwell time may be 2 hours. In some embodiments, the dwell temperature may be in the range of 770 C to 1200 C. In another exemplary embodiment, the dwell temperature may be 1000 C and the dwell time may be 15 minutes. In another exemplary embodiment, the dwell temperature may be 1150 and the dwell time may be 30-45 minutes. In some embodiments, the dwell temperature does not exceed a maximum of 1200 C. In some embodiments, the dwell temperature does not exceed a maximum of 1300 C. Upon achieving sufficient braze dwell time, the furnace may be cooled at a rate of 20 C per minute, or lower when the inherent furnace cooling rate is less, to room temperature. The furnace may be brought to atmospheric pressure, opened and the brazed assembly may be removed for inspection, characterization and/or evaluation.

The use of too high of a temperature, for too long of a time period, may lead to voids forming in the joining layer as the result of significant aluminum evaporation. As voids form in the joining layer, the hermeticity of the joint may be lost. The use of too low of a temperature may lead to joints which are not hermetic. The process temperature and the time duration of the process temperature may be controlled such that the aluminum layer does not evaporate away, and so that a hermetic joint is achieved. With proper temperature and process time duration control, in addition to the other process parameters described above, a continuous joint may be formed. A continuous joint achieved in accord with embodiments as described herein will result in a hermetic sealing of the parts, as well as a structural attachment.

The brazing material will flow and allow for wetting of the surfaces of the ceramic materials being joined. When ceramic such as aluminum nitride is joined using aluminum brazing layers and in the presence of sufficiently low levels of oxygen and described herein, the joint is a hermetic brazed joint. This stands in contrast to the diffusion bonding seen in some prior ceramic joining processes.

Both hermetic and non-hermetic joints may join pieces strongly, in that significant force is needed to separate the pieces. However, the fact that a joint is strong is not determinative of whether the joint provides a hermetic seal. The ability to obtain hermetic joints may be related to the wetting of the joint. Wetting describes the ability or tendency of a liquid to spread over the surface of another material. If there is insufficient wetting in a brazed joint, there will be areas where there is no bonding. If there is enough non-wetted area, then gas may pass through the joint, causing a leak.

Acoustic imaging of the joint allows for viewing of the uniformity of the joint, and for determination of whether voids and/or passages exist in the joint. The resulting images of joints tested to be hermetic show uniform, voidless joints, while images of joints tested to be non-hermetic show voids, or large non-bonded areas, in the ceramic-braze layer interface area. In the examples seen in the acoustic images, rings have been bonded to a flat surface. The rings are typically 1.40 inches outer diameter, 1.183 inches interior diameter, with a joint interface area of approximately 0.44 square inches.

Figure 14:
FIG. 14 is a view representing the joint integrity of a joint.

FIG. 14 is an image created using acoustic sensing of the joint integrity of a joint. The joint was between two pieces of poly-crystalline aluminum nitride. In this joint, mesa standoffs were used to maintain a minimum joint thickness. Three mesas were on the circular shaft element. The mesas were 0.004 inches high. The brazing material was aluminum of >99%. The brazing layer was 0.006 inches thick prior to brazing. The joining temperature was 1200 C held for 30 minutes. The joining was done in a process chamber held at pressure lower than 1×10E-5 Torr. An applied load of 18 pounds was used to apply pressure across the joint. The standoffs prevented the joint thickness from becoming lower than the standoff height. In this case of using a set of standoff mesas, the wetting of the joint is seen to be superior to that seen in the prior joint images. There is full wetting of the joint and an absence of voids.

The presence of a significant amount of oxygen or nitrogen during the brazing process may create reactions which interfere with full wetting of the joint interface area, which in turn may result in a joint that is not hermetic. Without full wetting, non-wetted areas are introduced into the final joint, in the joint interface area. When sufficient contiguous non-wetted areas are introduced, the hermeticity of the joint is lost.

The presence of nitrogen may lead to the nitrogen reacting with the molten aluminum to form aluminum nitride, and this reaction formation may interfere with the wetting of the joint interface area. Similarly, the presence of oxygen may lead to the oxygen reacting with the molten aluminum to form aluminum oxide, and this reaction formation may interfere with the wetting of the joint interface area. Using a vacuum atmosphere of pressure lower than 5×10-5 Torr has been shown to have removed enough oxygen and nitrogen to allow for fully robust wetting of the joint interface area, and hermetic joints. In some embodiments, use of higher pressures, including atmospheric pressure, but using non-oxidizing gasses such as hydrogen or pure noble gasses such as argon, for example, in the process chamber during the brazing step has also led to robust wetting of the joint interface area, and hermetic joints. In order to avoid the oxygen reaction referred to above, the amount of oxygen in the process chamber during the brazing process must be low enough such that the full wetting of the joint interface area is not adversely affected. In order to avoid the nitrogen reaction referred to above, the amount of nitrogen present in the process chamber during the brazing process must be low enough such that the full wetting of joint interface area is not adversely affected.

The selection of the proper atmosphere during the brazing process, coupled with maintaining a minimum joint thickness, may allow for the full wetting of the joint. Conversely, the selection of an improper atmosphere may lead to poor wetting, voids, and lead to a non-hermetic joint. The appropriate combination of controlled atmosphere and controlled joint thickness along with proper material selection and temperature during brazing allows for the joining of materials with hermetic joints.

Another advantage of the joining method as described herein is that joints made according to some embodiments of the present invention may allow for the disassembly of components, if desired, to repair or replace one of those two components. Because the joining process did not modify the ceramic pieces by diffusion of a joining layer into the ceramic, the ceramic pieces are thus able to be re-used.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A process for the repair of a substrate support pedestal, said process comprising the steps of:
    machining down a top surface of a substrate support pedestal to create a first new top surface;
    placing a braze layer in between said first new top surface of said substrate support pedestal and a new top ceramic layer; and
    brazing said new top ceramic layer to said first new top surface of said substrate support pedestal, thereby creating a hermetic joint between said new top ceramic layer to said first new top surface of said substrate support pedestal, wherein the step of machining down a top surface of a substrate support pedestal to create a first new top surface comprises machining through and removing an RF antenna.

2. A process for the repair of a substrate support pedestal, said process comprising the steps of:
    machining down a top surface of a substrate support pedestal to create a first new top surface;
    placing a braze layer in between said first new top surface of said substrate support pedestal and a new top ceramic layer; and
    brazing said new top ceramic layer to said first new top surface of said substrate support pedestal, thereby creating a hermetic joint between said new top ceramic layer to said first new top surface of said substrate support pedestal, wherein the step of machining down a top surface of a substrate support pedestal to create a first new top surface comprises machining through and removing a clamping electrode.

3. The process of claim 1 wherein said braze layer comprises aluminum of greater than 99% by weight.

4. The process of claim 2 wherein said braze layer comprises aluminum of greater than 99% by weight.

5. The process of claim 3 wherein the step of brazing said new ceramic top layer to said first new top surface of said substrate support pedestal comprises brazing at a temperature between 800 and 1200C.

6. The process of claim 3 wherein the step of brazing said new ceramic top layer to said first new top surface of said substrate support pedestal comprises brazing at a temperature between 770 and 1200C.

7. The process of claim 4 wherein the step of brazing said new ceramic top layer to said first new top surface of said substrate support pedestal comprises brazing at a temperature between 800 and 1200C.

8. The process of claim 4 wherein the step of brazing said new ceramic top layer to said first new top surface of said substrate support pedestal comprises brazing at a temperature between 770 and 1200C.

9. The process of claim 1 further comprising the step of machining down the top surface of said new top ceramic layer after the step of brazing said new top ceramic layer to said first new top surface of said substrate support pedestal.

10. The process of claim 6 further comprising the step of machining down the top surface of said new top ceramic layer after the step of brazing said new top ceramic layer to said first new top surface of said substrate support pedestal.

11. The process of claim 8 further comprising the step of machining down the top surface of said new top ceramic layer after the step of brazing said new top ceramic layer to said first new top surface of said substrate support pedestal.

12. The process of claim 5 further comprising the step of machining down the top surface of said new top ceramic layer after the step of brazing said new top ceramic layer to said first new top surface of said substrate support pedestal.

13. The process of claim 5 wherein the step of brazing further comprises placing the pedestal assembly into a vacuum oven with a pressure below 1×10E-4 torr.

14. The process of claim 7 wherein the step of brazing further comprises placing the pedestal assembly into a vacuum oven with a pressure below 1×10E-4 torr.

15. The process of claim 6 wherein the step of brazing further comprises placing the pedestal assembly into a vacuum oven with a pressure below 1×10E-4 torr.

16. The process of claim 8 wherein the step of brazing further comprises placing the pedestal assembly into a vacuum oven with a pressure below 1×10E-4 torr.

17. The process of claim 1 wherein said braze layer comprises aluminum of greater than 98% by weight.

18. The process of claim 2 wherein said braze layer comprises aluminum of greater than 98% by weight.

19. The process of claim 17 wherein the step of brazing said new ceramic top layer to said first new top surface of said substrate support pedestal comprises brazing at a temperature between 770 and 1200C.

20. The process of claim 18 wherein the step of brazing said new ceramic top layer to said first new top surface of said substrate support pedestal comprises brazing at a temperature between 770 and 1200C.

21. The process of claim 19 wherein the step of brazing further comprises placing the pedestal assembly into a vacuum oven with a pressure below 1×10E-4 torr.

22. The process of claim 20 wherein the step of brazing further comprises placing the pedestal assembly into a vacuum oven with a pressure below 1×10E-4 torr.

* * * * *